United States Patent [19]

Kawashima

[11] Patent Number: 5,201,068
[45] Date of Patent: Apr. 6, 1993

[54] RADIO TELECOMMUNICATIONS APPARATUS

[75] Inventor: Kazuhiro Kawashima, Tokyo, Japan

[73] Assignee: Kabushiki Kaisha Toshiba, Kawasaki, Japan

[21] Appl. No.: 550,443

[22] Filed: Jul. 10, 1990

[30] Foreign Application Priority Data

Jul. 18, 1989 [JP] Japan ........................... 1-185765

[51] Int. Cl.⁵ ..................... H04B 1/38; H03G 3/02
[52] U.S. Cl. ................................ 455/89; 455/234.2; 381/109
[58] Field of Search .............. 455/79, 89, 116, 234; 381/107, 108, 109, 42, 43

[56] References Cited

U.S. PATENT DOCUMENTS

| 4,385,204 | 5/1983 | Wine | 381/109 |
| 4,481,384 | 11/1984 | Matthews | 381/42 |
| 4,651,114 | 3/1987 | Steinmayer, Jr. et al. | 455/116 |
| 4,827,520 | 5/1989 | Zeinstra | 381/42 |

*Primary Examiner*—Reinhard J. Eisenzopf
*Assistant Examiner*—Timothy H. Keough
*Attorney, Agent, or Firm*—Finnegan, Henderson, Farabow, Garrett and Dunner

[57] ABSTRACT

A radio telecommunication apparatus comprises a volume key for controlling volume, detecting means for generating a first detection signal in response to continuous push of the volume key, and generating a second detection signal in response to intermittent push of the volume key, and voice volume control means for performing control to increase the volume in response to one of the first and second detection signals, and performing control to decrease the volume in response to the other of the first and second detection signals.

4 Claims, 6 Drawing Sheets

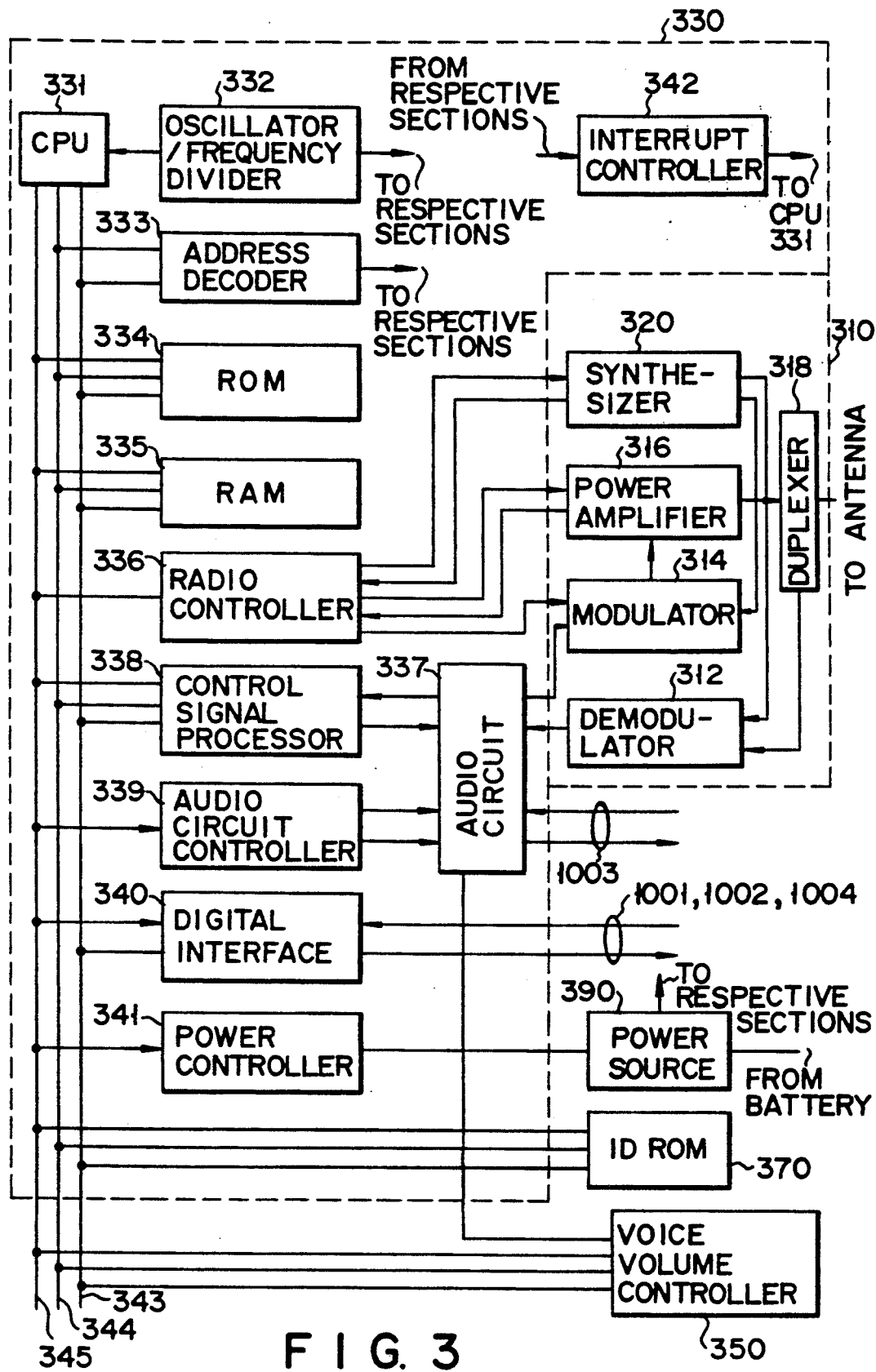
F I G. 3

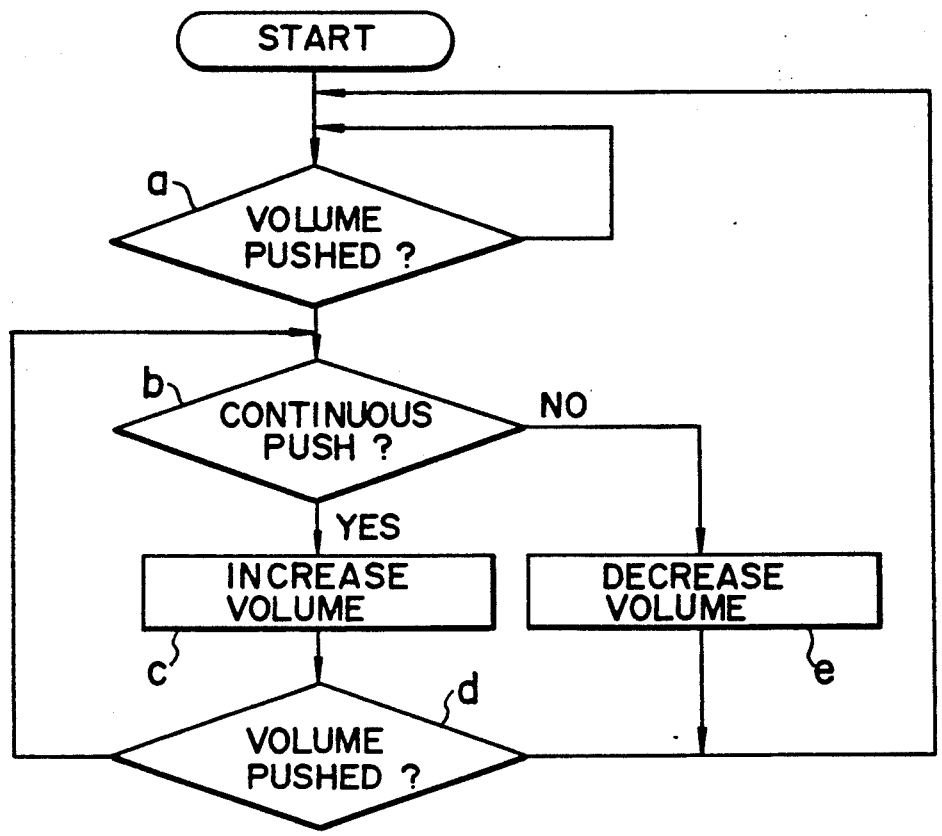
F I G. 5
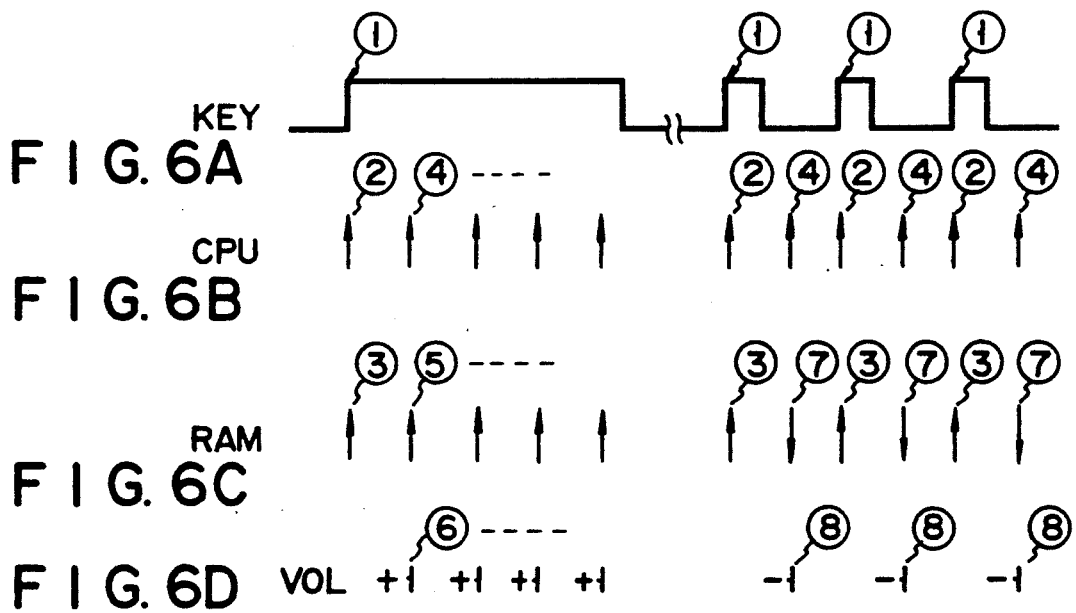
F I G. 6A
F I G. 6B
F I G. 6C
F I G. 6D

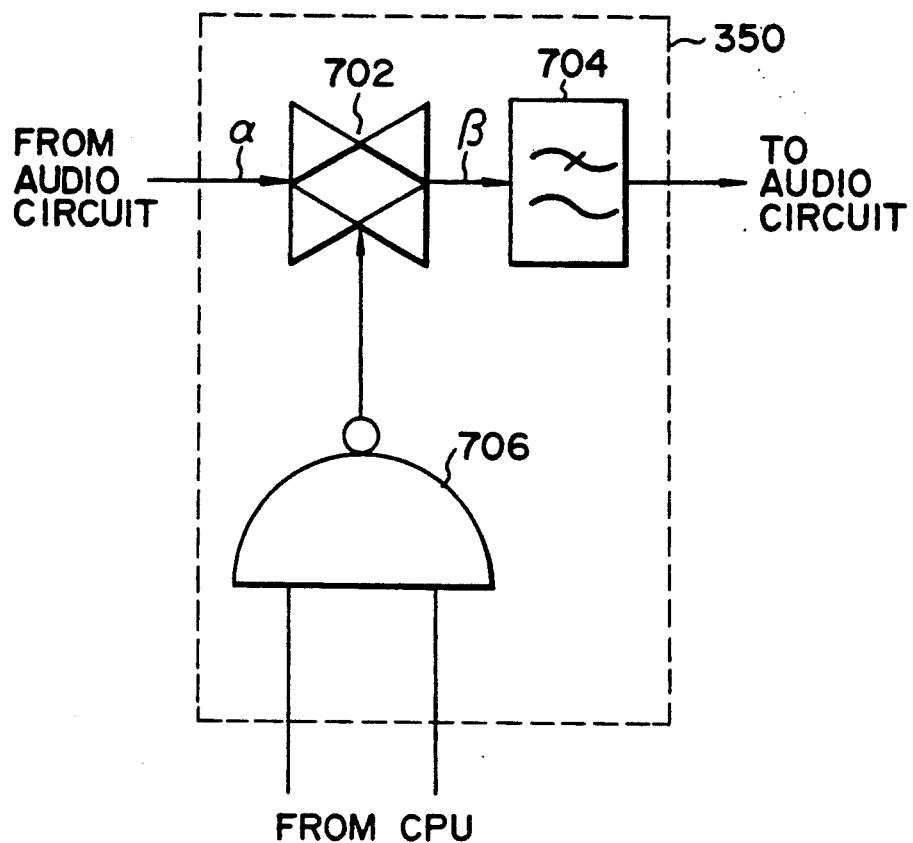
F I G. 7
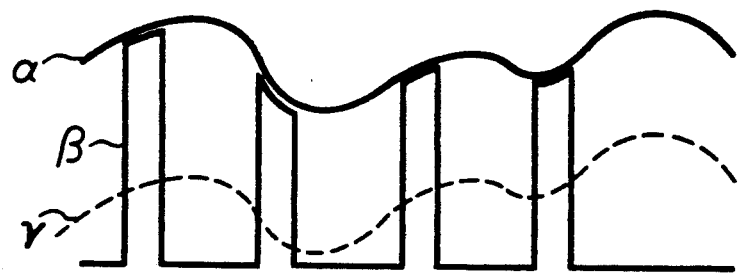
F I G. 8

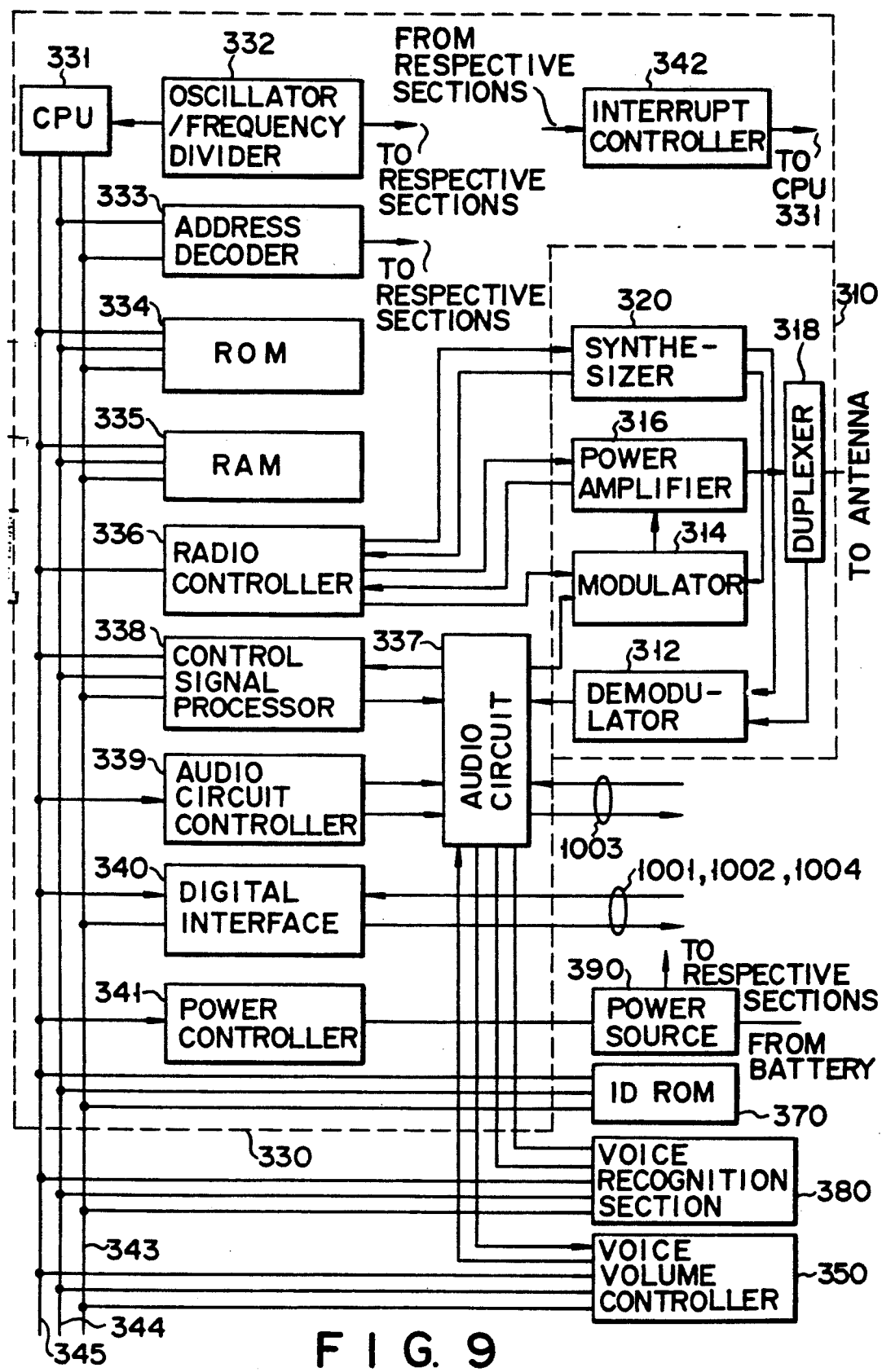
F I G. 9

RADIO TELECOMMUNICATIONS APPARATUS

BACKGROUND OF THE INVENTION

1. Field of the Invention

The present invention relates to a radio telecommunication apparatus.

2. Description of the Related Art

Since automobile telephone apparatuses are used while driving, they are often designed to perform speech communication not only by a handset but also by a handsfree arrangement constituted by a unit microphone and a loudspeaker. Such an arrangement requires a means for allowing a user to control the volume of the loudspeaker.

As such a control means, a combination of push-type volume up and down keys is generally used. These keys are, for example, arranged together in a concentrated manner with numerical keys and function keys, as shown in FIG. 1, so as to improve its operability.

Similar to various types of electronic devices, automobile telephone apparatuses are required to be relatively small in size. A demand for reduction in size is high especially for a so-called portable automobile telephone apparatus, in which a handset serves as a radio telecommunication apparatus independently of a main body, in order to improve its portability. In this case, since the above-mentioned keys are arranged on the handset, they are also required to be decreased in number. In order to satisfy such a demand, some apparatuses are designed such that the above-mentioned volume keys are replaced with one volume key, and in response to depression of the volume keys the volume is changed in only one direction in which the volume is increased or decreased. If, for example, volume changes are set in the direction to increase in response to the push of the key, the volume is increased upon pushing of the key. When the volume reaches the maximum level, it is increased from the minimum level again.

In this case, however, it takes much time to set the volume to a desired level by changing the volume in a direction reverse to a desired direction. In addition, since the volume is greatly changed when it shifts from the maximum level to the minimum level, a problem is posed in terms of operability.

SUMMARY OF THE INVENTION

It is a first object of the present invention to provide a radio telecommunication apparatus which can change the volume by using one volume key in two directions to increase and decrease the volume.

It is a second object of the present invention to provide a radio telecommunication apparatus which can change the volume by a voice command.

According to the first aspect of the present invention, there is provided a radio telecommunication apparatus comprising:

a volume key for controlling volume;

detecting means for generating a first detection signal in response to continuous push of the volume key, and generating a second detection signal in response to intermittent push of the volume key; and voice volume control means for performing control to increase the volume in response to one of the first and second detection signals, and performing control to decrease the volume in response to the other of the first and second detection signals.

According to a first embodiment of the radio telecommunication apparatus of the present invention, the volume is increased and decreased in accordance with a first state in which the volume key is continuously depressed and a second state in which the volume key is intermittently depressed. Therefore, the volume can be changed by using one volume key in the two directions to increase and decrease the volume.

According to the second aspect of the present invention, there is provided a radio telecommunication apparatus comprising:

mode setting means for setting a voice volume control mode;

voice input means for receiving a voice associated with volume control;

voice recognition means for recognizing the voice and generating a signal for changing the volume while the voice volume control mode is set by the mode setting means; and voice volume control means for controlling the volume in response to the signal.

According to a second embodiment of the radio telecommunication apparatus of the present invention, the volume is increased and decreased in accordance with a voice command associated with volume control. Therefore, the volume may be easily controlled.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a block diagram showing a radio unit of the radio telecommunication apparatus of the first embodiment;

FIG. 5 is a flow chart for explaining an operation of the radio telecommunication apparatus of the first embodiment;

FIGS. 6A to 6D are views for explaining a control operation inside the apparatus for realizing an operation of the radio telecommunication apparatus of the first embodiment;

FIG. 7 is block diagram showing a voice volume controller;

FIG. 8 is a graph showing the waveforms of signals output from the respective components of the voice volume controller; and FIG. 9 is a block diagram showing a radio telecommunication apparatus according to the second embodiment of the present invention.

DETAILED DESCRIPTION OF THE PREFERRED EMBODIMENTS

Embodiments of the present invention will be described below with reference to the accompanying drawings. An embodiment will be described in which a radio telecommunication apparatus of the present invention is applied to an automobile telephone apparatus.

Figure 2:
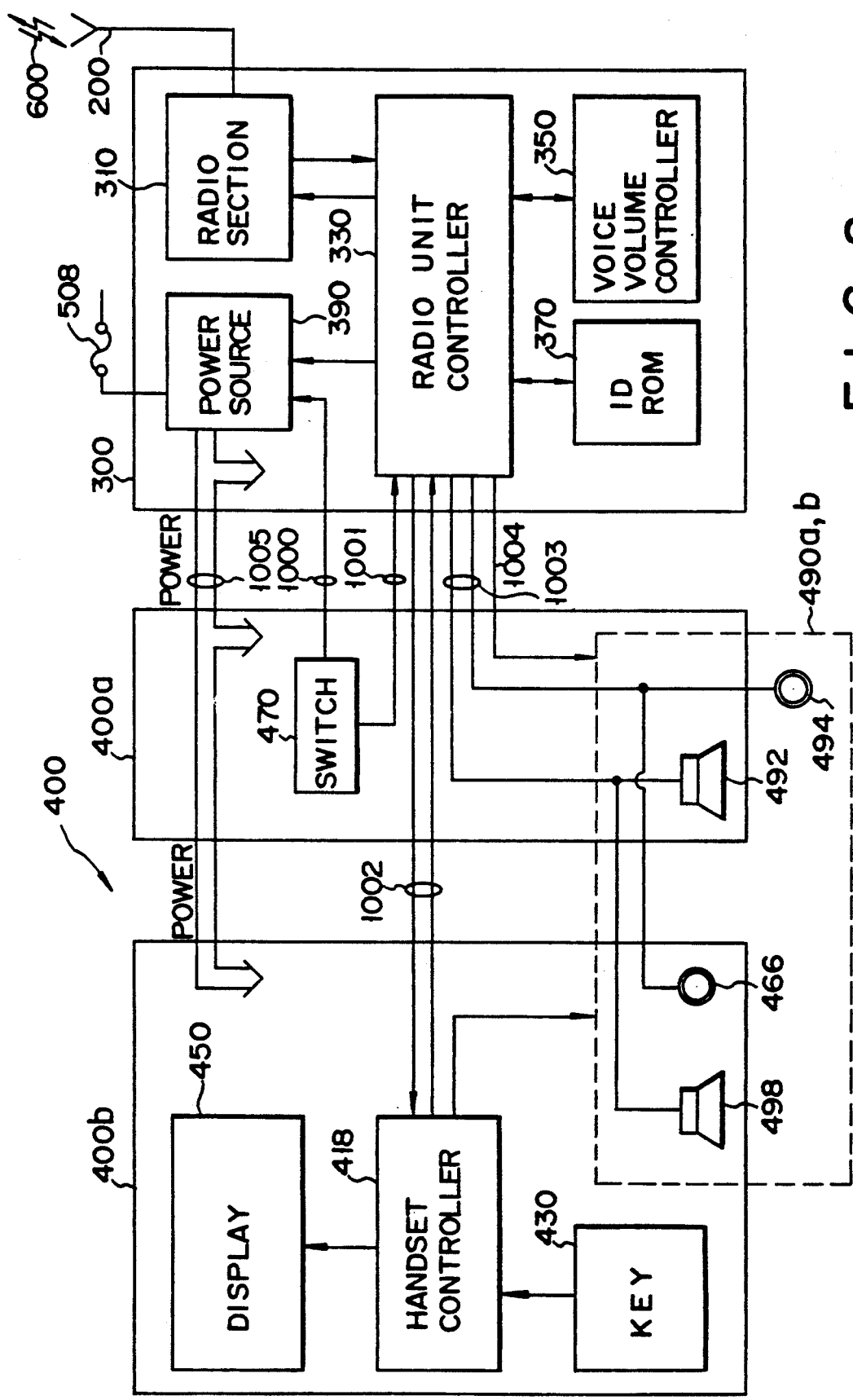
FIG. 2 is a block diagram showing a radio telecommunication apparatus according to the first embodiment of the present invention.

FIG. 2 is a block diagram showing an arrangement of a radio telecommunication apparatus exemplified in a first embodiment of the present invention. The radio telecommunication apparatus shown in FIG. 2 comprises an antenna 200, a radio unit 300, and a telephone unit 400. The antenna 200 is mounted on an outer body surface of an automobile. The telephone unit 400 is mounted near the driver's seat inside the automobile.

The radio unit 300 includes a radio section 310 for establishing a radio channel 600 with a base station (not shown) through the antenna 200 and for exchanging signals therewith, a radio unit controller 330 for controlling the overall operations of the apparatus, a voice volume controller 350 for controlling the volume, an ID ROM 370 for storing ID numbers and telephone numbers of corresponding systems, and a power source 390 for supplying power from the battery mounted in the automobile to the above components through a fuse 508.

The telephone unit 400 includes a handset controller 418 for controlling the overall operations of the telephone unit 400 in response to instructions or the like from the ratio unit controller 330, a key unit 430 for entering key inputs, a display unit 450 for displaying alphanumeric information in response to control signals from the handset controller 418, switches 470 including a hook switch and a power switch, and selectable audio input/output units 490a and 490b for inputting or outputting an audible sound. The telephone unit 400 may be divided into a main unit 400a and a handset 400b. A microphone 494 may be a handsfree microphone 494 mounted on a sun visor or the like near the driver's seat and is connected to the main unit 400a. A loudspeaker 492 may be mounted in the main unit 400a. The handset controller 418, the key unit 430, and the display unit 450 are mounted in the handset 400b. A handset microphone 466 and a handset receiver 498 constitute the audio input/output unit 490b of the handset 400b.

Each of the radio unit 300, the main unit 400a, and the handset 400b is supplied with power through a power line 1005 extending from the power source 390 in the radio unit 300. The ON/OFF state of the switches 470 is transmitted to the power source 390 or the radio unit controller 330 through a line 1000 or line 1001, respectively. Control and/or command signals are transmitted between the handset controller 418 and the radio unit controller 330 through lines 1002. Audio signals are transmitted through lines 1003. The radio controller 330 sends control signals to the audio input/output units 490a and 490b through a line 1004.

FIG. 3 is a block diagram showing a detailed arrangement of the radio unit in FIG. 2. Referring to FIG. 3, the radio section 310 comprises a demodulator 312, a modulator 314, and a synthesizer 320. The demodulator 312 demodulates a radio signal received from the base station through the radio channel 600, the antenna 200, and a duplexer 318. It should be noted that this signal includes audible sound signals and control signals. The modulator 314 modulates the audio and control signals received from the radio controller 300 and generates the required transmission signals.

A power amplifier 316 amplifies the transmission signals received from the modulator 314. The amplification of the power amplifier 316 may be continuous or variable in a stepwise manner, e.g., 8-step variable. The duplexer 318 sends the signals received through the radio channel 600 to the demodulator 312 and the signals from the modulator 314 and the power amplifier 316 to the antenna 200. The synthesizer 320 is formed of a channel selection local oscillator and specifies a frequency from which signals are demodulated by the demodulator 312 and a frequency to which signals are modulated by the modulator 314. About 666 channels are available from the synthesizer 320.

The radio unit controller 330 comprises a central processing unit (CPU) 331, an oscillator/frequency divider 332, an address decoder 333, a ROM 334, a RAM 335, a radio controller 336, an audio circuit 337, a control signal processor 338, an audio circuit controller 339, a digital interface 340, a power controller 341, and an interrupt controller 342. Reference numerals 343, 344, and 345 denote a data bus, an address bus, and a control bus, respectively.

The CPU 331 controls the operation of the radio unit controller 330. The oscillator/frequency divider 332 supplies clock signals to the CPU 331 and divides the clock signals to supply appropriate frequency-divided pulses as timing pulses to each section of the mobile telephone apparatus. The address decoder 333 outputs predetermined operation signals to the respective components in response to instruction signals from the CPU 331. The ROM 334 stores various programs required for operations of the CPU 331. The RAM 335 stores various types of data used during processing by the CPU 331. The radio controller 336 controls the radio section 310 in response to instructions from the CPU 331. For example, the radio controller 336 sends signals indicative of available frequencies to the synthesizer 320, signals indicative of an amplification level to the power amplifier 316, and signals indicative of modulation parameters to the modulator 314. The radio controller 336 receives a step-out signal from the synthesizer 320 and output power detection signals from the power amplifier 316 and forwards these signals to the CPU 331, thereby preventing operational errors.

The audio circuit 337 extracts control signals and audio signals from the received signals demodulated by the demodulator 312 and supplies the control signals to the control signal processor 338 and the audio signals to the telephone unit 400. The audio circuit 337 also supplies a control signal from the control signal processor 338 and audio signals from the telephone set 400 to the modulator 314. It should be noted that the audio circuit 337 also arranges the waveform of the control signal to be sent to the control signal processor 338 in a particular signal format and filters the control signal to be supplied to the modulator 314. The control signal processor 338 acquires bit and frame synchronization with the control signal from the audio circuit 337. Maintaining the required synchronization, the control signal processor 338 converts the serial control signals, including control data from a base station, into parallel signals and converts the parallel control data signals to be transmitted to a base station into serial signals. The control signals are sent to and from the base station via the audio circuit 337.

The audio circuit controller 339 controls the audio circuit 337. Under the control of the audio circuit controller 339, for example, the audio circuit 337 applies the received signals from the demodulator 312 to the control signal processor 338 or the telephone unit 400 and selectively receives the signals from the control signal processor 338 or the telephone unit 400. The digital interface 340 interfaces the data communication between the radio unit 300 and the telephone unit 400. The power controller 341 controls the power source 390 and sets a voltage supplied from a battery 506 to the power source 390 to a predetermined level. The voltage having the predetermined level is supplied to the respective circuit components.

Figure 1:
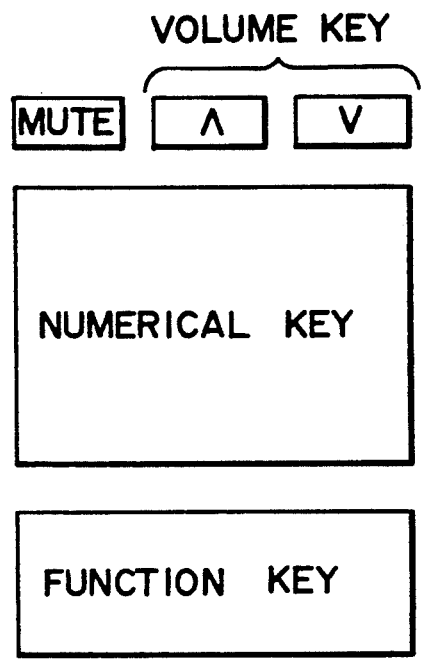
FIG. 1 is a view showing an arrangement of components constituting a conventional operation input section.
Figure 4:
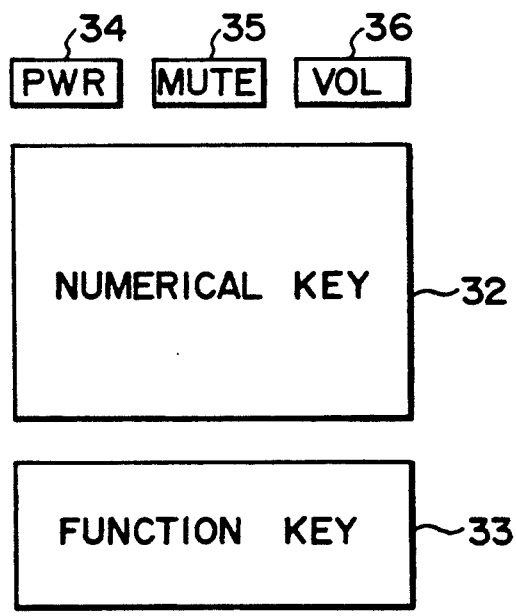
FIG. 4 is a view showing an arrangement of components constituting an operation input section of the radio telecommunication apparatus of the first embodiment.

FIG. 4 shows an arrangement of components constituting the above-mentioned handset 400b.

As shown in FIG. 4, the handset 400b comprises numerical keys 32, function keys 33, a power key (power source ON/OFF key) 34, a mute key 35, and a volume key 36.

In this embodiment, volume changes in both directions to increase and decrease the volume are controlled by the single volume key 36.

This operation will be described below with reference to a flow chart shown in FIG. 5. If it is determined in step a that the volume key is pushed, and continuous push (the key is continuously pushed) is determined in step b, the volume is controlled in the direction to be increased while the key 36 is kept pushed in steps c and d.

In contrast to this, if the volume key 36 is pushed, and it is determined in step b that the key 36 is not continuously pushed, the volume is controlled in the direction to be decreased by a predetermined amount.

If, therefore, the volume is to be increased to a desired level, a user is only required to keep pushing the volume key 36 until the volume reaches the level. If the volume is to be decreased to a desired level, the user is only required to intermittently push the volume key 36 until the volume reaches the level.

A control operation inside the apparatus for realizing such operations will be described below with reference to FIGS. 6A to 6D.

If the volume key 36 is pushed in a manner indicated by ① in FIG. 6A, the CPU 331 detects this in a manner indicated by ② in FIG. 6B, and sets flags in predetermined memory spaces of the RAM 335 in a manner indicated by ③ in FIG. 6C.

As indicated by ④ FIG. 6B, when a predetermined period of time, e.g., 50 ms has elapsed after the volume key 36 is depressed, the CPU 331 checks whether the volume key 36 is kept pushed.

If it is detected that the volume key 36 is pushed, the CPU 331 sets a flag in a predetermined memory space of the RAM 335 as indicated by ⑤ in FIG. 6C, and compares it with the immediately preceding flag. In this case, since both the flags are in a set state, control is performed to increase the volume, as indicated by ⑥ in FIG. 6D. In this step, if adjacent flags in the RAM 335 are in a set state, control is performed to increase the volume.

In contrast to this, if it is detected that the volume key 36 is not pushed, the CPU 331 resets flags in predetermined memory spaces of the RAM 335 as indicated by ⑦ in FIG. 6C, and compares each flag with a corresponding one of the immediately preceding flags. In this case, since one flag of each pair is in a reset state, control is performed to decrease the volume, as indicated by ⑧ in FIG. 6D. Note that in this step, the volume is controlled to be decreased only when a flag in the RAM 335 is changed from a set state to a reset state.

A circuit arrangement of the voice volume controller 350 will be described below with reference to FIGS. 7 and 8. The voice volume controller 350 comprises a transmission gate 702, a low-pass filter 704, and a NAND circuit 706. A clock pulse is input from the CPU 331 to the input terminal of the NAND circuit 706 through the control bus. A speech signal represented by $\alpha$ and input to the transmission gate 702 is output from the transmission gate 702 as a signal represented by $\beta$ in response to a pulse output from the NAND circuit 706. The output signal $\beta$ is supplied to the low-pass filter 704 to be smoothed, and is output from the voice volume controller 350 as a signal represented by $\gamma$. The amplitude of the signal $\gamma$ corresponds to the volume level. Therefore, if the duty ratio of an output pulse from the NAND circuit 706 is controlled in accordance with a change in set/reset state of each flag in the RAM 335, the amplitude of the signal $\gamma$ can be changed, and the volume can be increased and decreased.

As described above, in this embodiment, since volume changes in both the directions in which it is increased and decreased are controlled by the single volume key 36, the conventional problems can be solved, e.g., that it takes much time to set the volume to a desired level when the volume is increased/decreased in a direction reverse to a desired direction, and that the volume is greatly changed when it shifts from the maximum level to the minimum level, resulting in poor operability.

In the above-described embodiment, when the volume key 36 is continuously pushed, the volume is controlled in the direction to be increased, whereas when it is intermittently pushed, the volume is controlled in the direction to be decreased. However, the present invention can be applied to a case reverse to the above case. That is, when the volume key 36 is continuously pushed, the volume may by controlled in the direction to be decreased, and vice versa.

The control operation and the like shown in FIGS. 6A to 6D are only examples of the present invention, and may be replaced with other known techniques.

The second embodiment of the present invention will be described below with reference to FIG. 9.

As shown in FIG. 9, a radio telecommunication apparatus of this embodiment has the same arrangement as that of the telecommunication apparatus shown in FIG. 2 except for a voice recognition section 380 having the following function.

The voice recognition section 380 is connected to a CPU 331 through a data bus 343, an address bus 344, and a control bus 345 and is operated under the control of the CPU 331. Such a voice recognition section 380 is disclosed in, e.g., U.S. Ser. No. 242,677 filed on Sep. 9, 1988.

If a volume key 36 is continuously pushed for a predetermined period of time or more, the CPU 331 detects this push and sets a voice volume mode.

When the volume is to be increased in the voice volume mode, "Up" is uttered. A voice recognition section 380 then detects this utterance and acknowledges the CPU 331 that the volume is to be increased. The CPU 331 executes the instruction and performs a control operation to increase the volume. In this case, the volume may be increased by one preset level per utterance "Up".

When the volume is to be decreased, "Down" is uttered. In this case, the voice recognition section 380 detects this utterance, and the CPU 331 executes the instruction and performs a control operation to decrease the volume in a similar manner. In this case, the volume may be decreased by one preset level per utterance "Down".

The voice volume mode is canceled when the volume key 36 is pushed again and the CPU 331 detects this. Alternatively, this mode is canceled by time-out control by means of a timer arranged in the CPU 331, i.e., when the above-mentioned utterances are not made for a predetermined period of time after the voice volume mode is set.

Note that in this embodiment, the volume may be increased by two levels or more by continuously uttering "Up" or uttering "Up 3".

In addition, the volume may be set to a maximum value and a predetermined value by uttering "Max", "Midiam", and the like.

The voice volume controller 350 used in this embodiment may have the same arrangement as that of the controller 350 in the first embodiment.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A radio telecommunication apparatus comprising:
   a volume key for controlling volume;
   detecting means for generating a first detection signal in response to continuous depression of said volume key for a predetermined period, and generating a second detection signal in response to intermittent depression of said volume key, said predetermined period of the continuous depression being longer than a period during which said volume key is being depressed in intermittent depression; and
   voice volume control means for increasing the volume in response to one of the first and second detection signals, and for decreasing the volume in response to the other of the first and second detection signals.

2. A radio telecommunication apparatus comprising:
   a volume key for controlling volume;
   detecting means for generating a first detection signal in response to continuous depression of said volume key, and generating a second detection signal in response to intermittent depression of said volume key; and
   voice volume control means for increasing the volume in response to one of the first and second detection signals, and for decreasing the volume in response to the other of the first and second detection signals,
   wherein said detecting means includes:
      checking means for periodically checking a state of said volume key, setting a first flag in response to a depressed state of said volume key; and setting a second flag in response to a non-depressed state of said volume key, and
      means for detecting a first event wherein a first flag is sequentially followed by a second flag and a second event wherein a first flag is sequentially followed by another first flag, and
   wherein said voice volume control means increases the volume in response to one of the first and second events, and decreases the volume in response to the other of the first and second events.

3. The apparatus according to claim 1, wherein said voice volume control means includes:
   output means for outputting a pulse having a first duty ratio in response to one of the first and second detection signals, and outputting a pulse having a second duty ratio in response to the other of the first and second detection signals,
   a transmission gate for receiving a speech signal and selectively outputting a predetermined portion of the speech signal in response to the pulses, and
   smoothing means for smoothing the output from said transmission gate.

4. The apparatus according to claim 1, wherein said detecting means includes:
   checking means for periodically checking a state of said volume key, setting a first flag in response to a depressed state of said volume key, and setting a second flag in response to a non-depressed state of said volume key, and
   means for detecting a first event wherein a first flag is sequentially followed by a second flag and a second event wherein a first flag is sequentially followed by another first flag,
   wherein said voice volume control means increases the volume in response to one of the first and second events, and decreases the volume in response to the other of the first and second events.

* * * * *